US009678142B2

(12) United States Patent
Ryckaert et al.

(10) Patent No.: US 9,678,142 B2
(45) Date of Patent: Jun. 13, 2017

(54) TWO-STEP INTERCONNECT TESTING OF SEMICONDUCTOR DIES

(71) Applicant: IMEC, Leuven (BE)

(72) Inventors: Julien Ryckaert, Tervuren (BE); Erik Jan Marinissen, Leuven (BE); Dimitri Linten, Boortmeerbeek (BE)

(73) Assignee: IMEC, Leuven (BE)

( * ) Notice: Subject to any disclaimer, the term of this patent is extended or adjusted under 35 U.S.C. 154(b) by 462 days.

(21) Appl. No.: 14/247,019

(22) Filed: Apr. 7, 2014

(65) Prior Publication Data

US 2014/0300379 A1    Oct. 9, 2014

(30) Foreign Application Priority Data

Apr. 8, 2013    (EP) .................................... 13162824

(51) Int. Cl.
*G01R 31/20*    (2006.01)
*G01R 31/26*    (2014.01)
*H01L 21/66*    (2006.01)
*G01R 31/3185*    (2006.01)
*H01L 25/065*    (2006.01)

(52) U.S. Cl.
CPC ..... *G01R 31/2644* (2013.01); *G01R 31/2601* (2013.01); *G01R 31/318505* (2013.01); *H01L 22/32* (2013.01); *H01L 25/065* (2013.01); *G01R 31/26* (2013.01); *H01L 2224/16145* (2013.01); *H01L 2224/16225* (2013.01); *H01L 2924/15192* (2013.01); *H01L 2924/15311* (2013.01)

(58) Field of Classification Search
CPC ........ G01R 31/2644; G01R 31/318505; G01R 31/2601; H01L 25/065; H01L 22/23; H01L 2224/16225; H01L 2224/16145; H01L 2924/15192; H01L 2924/15311
USPC .................. 324/754.03, 500, 537, 754.01
See application file for complete search history.

(56) References Cited

U.S. PATENT DOCUMENTS

| 3,746,973 | A | 7/1973 | McMahon, Jr. |
| 5,383,269 | A | 1/1995 | Rathmell et al. |
| 5,517,515 | A | 5/1996 | Spall et al. |

(Continued)

FOREIGN PATENT DOCUMENTS

| EP | 2 372 379 A1 | 10/2011 |
| EP | 2 541 415 A1 | 1/2013 |
| JP | 2007-315789 | 12/2007 |

OTHER PUBLICATIONS

European Search Report dated Sep. 13, 2013 in European Application No. 13162824.0.

*Primary Examiner* — Giovanni Astacio-Oquendo
(74) *Attorney, Agent, or Firm* — Knobbe, Martens, Olson & Bear LLP

(57) ABSTRACT

The present invention relates generally to testing of interconnects in a semiconductor die, and more particularly to testing of semiconductor chips that are three-dimensionally stacked via an interposer. In one aspect, a method for testing an interconnect in a semiconductor die comprises providing the semiconductor die, which includes a plurality of electrical contact elements formed at one or more surfaces of the semiconductor die, at least one interconnect-under-test disposed between a first electrical contact element and a second electrical contact element, and an electrical component electrically coupled between the interconnect-under-test and at least one third electrical contact element.

18 Claims, 10 Drawing Sheets

(56) References Cited

U.S. PATENT DOCUMENTS

| | | | | |
|---|---|---|---|---|
| 5,534,784 | A * | 7/1996 | Lum | G01R 1/07378 |
| | | | | 324/754.03 |
| 5,819,025 | A | 10/1998 | Williams | |
| 6,825,052 | B2 * | 11/2004 | Eldridge | G01R 1/07307 |
| | | | | 257/E23.021 |
| 7,029,932 | B1 | 4/2006 | Hiser et al. | |
| 7,141,994 | B2 * | 11/2006 | Akram | G01R 1/0483 |
| | | | | 324/756.02 |
| 7,307,528 | B2 * | 12/2007 | Glidden | G01R 31/3025 |
| | | | | 324/537 |
| 7,808,258 | B2 | 10/2010 | Mangrum et al. | |
| 7,982,468 | B2 | 7/2011 | Vacar et al. | |
| 8,836,327 | B2 * | 9/2014 | French | G01R 33/032 |
| | | | | 257/421 |
| 2004/0155328 | A1 * | 8/2004 | Kline | H01L 23/49805 |
| | | | | 257/700 |
| 2008/0018350 | A1 | 1/2008 | Chao et al. | |
| 2010/0155888 | A1 | 6/2010 | Christo et al. | |
| 2012/0097944 | A1 | 4/2012 | Lin et al. | |

* cited by examiner

TWO-STEP INTERCONNECT TESTING OF SEMICONDUCTOR DIES

INCORPORATION BY REFERENCE TO RELATED APPLICATIONS

Any and all priority claims identified in the Application Data Sheet, or any correction thereto, are hereby incorporated by reference under 37 CFR 1.57. This application claims foreign priority to European patent application EP 13162824.0 filed on Apr. 8, 2013. The aforementioned application is incorporated by reference herein in its entirety, and is hereby expressly made a part of this specification.

BACKGROUND OF THE INVENTION

Field of the Invention

The present invention relates generally to testing of interconnects in a semiconductor die, and more particularly to testing of semiconductor chips that are three-dimensionally stacked via an interposer.

Description of the Related Technology

The semiconductor industry is on an ongoing quest to integrate more functionality into a smaller form factor while increasing performance, lowering power consumption and/or reducing cost. Traditionally, two-dimensional and lateral scaling approaches have been predominantly used, including, for example, conventional CMOS scaling, including multiple IP cores in a single die (system-on-chip (SoC)), including multiple dies in a single package (multi-chip package (MCP)) and including multiple ICs on a printed circuit board (PCB). More recently, three dimensional scaling including scaling in the third, vertical dimension started to become exploited, including, for example, system-in-package (SiP), in which multiple naked dies are vertically stacked in a single IC package, and interconnected by means of wire-bonds to the substrate, and package-on-package (PoP), in which multiple packaged chips are vertically stacked.

In particular, three-dimensional (3D) stacking of chips is gaining increased interest, as it promises higher transistor densities and smaller footprints of electronic products. The latest evolution in this list of innovations is the so-called three-dimensional stacked IC (3D-SIC), which includes a single package containing a vertical stack of naked dies which are interconnected by means of inter-die interconnections, and can further include through-substrate-vias (TSVs). 3D stacking based on inter-die interconnections offers the benefits of more functionality, higher bandwidth and performance at smaller sizes, alongside lower power consumption and cost; and this even in an era in which conventional feature-size scaling becomes increasingly difficult and expensive.

Currently, a lot of research and development work is done around three-dimensional stacking of integrated circuits. Two popular set-ups are illustrated in FIG. 1(a) and FIG. 1(b). FIG. 1(a) illustrates an interposer-based 3D die stack in which multiple active dies 10, 11, 12 are placed side-by-side on top of and interconnected through an interposer 13, such as a semiconductor, e.g. silicon, interposer. The active dies 10, 11, 12 are typically connected to the interposer 13 by means of high-density micro-bumps 14, e.g. Cu and CuSn micro-bumps. In a typical set-up (as depicted in FIG. 1(a)), the interposer contains TSVs 15 that connect to external package pins. Such 3D stacks are attractive for high-performance compute and communication applications, as they offer high-bandwidth interconnect between various active dies 10, 11, 12 and good cooling opportunities. Also, such 3D stacks allow to break up a single large die into multiple dies 10, 11, 12 and hence increase the yield, and enable the combination of heterogeneous dies in a single product. It can be predicted that interposer-based 3D stacking with multiple active dies 10, 11, 12 placed side-by-side on top of and interconnected through an interposer 13 will evolve to 3D stacking, where multiple 3D towers 16, 17 of active dies are placed side-by-side of top of and interconnected through an interposer, for example a semiconductor interposer such as a silicon interposer, as for example illustrated in FIG. 1(b). Such 3D stacks are attractive also for hand-held and portable consumer electronics, due to their small footprint.

In order to reduce the overall system cost, there is a need to reduce the cost of fabricating the interposer 13. Typically, a low-cost process technology is used to fabricate such interposer 13 which can use: relatively larger feature sizes, predominantly passive components (i.e., minimum active components), mature process technologies, and high-yielding manufacturing processes.

Despite the high yield, it typically pays off to perform pre-bond testing of the interposer 13 before stacking. This is mainly driven by the cost ratio between the (cheap) interposer die 13 and the (more expensive) active dies 10, 11, 12 or die towers 16, 17 placed on top of it. If a faulty interposer 13 is detected only after stacking active dies 10, 11, 12 or die towers 16, 17 on top of it, the entire stack needs to be discarded, and in this way, "a 10¢ interposer can 'kill' two 50$ dies". Hence, there is a need for pre-bond ("Known-Good Die", KGD) testing of interposers 13 for manufacturing defects.

Testing an interposer which predominantly comprises passive components may not be conceptually very difficult. Nevertheless, testing the interposer can be practically difficult at least in part because of difficulty of accessing internal components of the interposer, e.g., interconnects, to be tested. For example, conventionally, testing an interconnect is typically performed by accessing both ends of the interconnect. To test horizontal interconnects in an interposer, the interconnects can be accessed from the top. However, the microbumps 14 at the top can be fine-pitched, for example, making it difficult to access the interconnects via a probe card. In addition, a suitable probe card may be expensive and/or introduce inaccuracies in touch-down. There might also be many interconnect ends to be probed, spread out over a large area. Moreover, ideally, probes would be placed at top and bottom of the interposer, to test signal paths from top to bottom of the interposer and vice versa. However, it is difficult to get such dual side access, as typically a wafer will be present on a chuck, thus reducing the access possibilities to single side access. Dual side probing on a thinned wafer poses yet more problems, in view of deformation of the thinned wafer which will occur (sagging, warping, etc.). Thus, there is a need for testing methods that can overcome the challenges associated with accessing internal components, e.g., interconnects, of a semiconductor die, such as an interposer,

SUMMARY OF CERTAIN INVENTIVE ASPECTS

It is an object of embodiments disclosed herein to provide a method for testing semiconductor dies, e.g. interposers, for manufacturing defects, and a semiconductor die, e.g. an interposer, which is testable for manufacturing defects.

The above objective is accomplished by a method and a device according to embodiments herein.

In a first aspect, the some embodiments provide a method for testing an interconnect in a semiconductor die such as for instance an interposer, the semiconductor die having at its surface a plurality of electrical contact elements, and comprising at least an interconnect-under-test between a first electrical contact element and a second electrical contact element, there being an electrical component electrically coupled between the interconnect-under-test and at least one third electrical contact element, optionally between the interconnect-under-test and at least two third electrical contact elements. The method comprises testing a first signal path in the semiconductor die for manufacturing defects, the first signal path comprising a first part of the interconnect-under-test and a first deviation path from the interconnect-under-test over the electrical component to a third electrical contact element, thus obtaining first test results; and testing a second signal path in the semiconductor die for manufacturing defects, the second signal path comprising a second part of the interconnect-under-test and a second deviation path from the interconnect-under-test over the electrical component to a third electrical contact element, thus obtaining second test results. The first and the second part of the interconnect-under-test together form the interconnect-under-test. The third electrical contact element used for the first deviation path and the third electrical contact element used for the second deviation path may either be one and the same contact element, or may be two different electrical contact elements. In the latter case, the third electrical contact elements may be called the third and the fourth electrical contact element.

A method according to some embodiments may furthermore comprise deciding, from the first and second test results, whether or not the interconnect-under-test suffers from manufacturing defects.

In particular embodiments, the interconnect-under-test may be a vertical interconnection between a first electrical contact element at a first major surface of the semiconductor die, e.g. interposer, and a second electrical contact element at a second major surface of the semiconductor die, e.g. interposer, opposite to the first major surface. In such case, testing a first signal path may comprise testing a path between the first electrical contact element and a third electrical contact element at the same major surface of the semiconductor die as the first electrical contact element. Testing a second signal path may comprise testing a path between the second electrical contact element and a third electrical contact element. This latter third electrical contact element may be the same as the third electrical contact element at the same major surface of the semiconductor die as the first electrical contact element. However, more advantageously is to use for the second third electrical contact element one of the at least one third contact elements which is provided at the same major surface of the semiconductor die as the second electrical contact element. This allows to perform a first measurement from one side of the semiconductor die, and a second measurement from the opposite side of the semiconductor die, both measurements together providing information about manufacturing defects for the complete interconnect.

In alternative embodiments, the interconnect-under-test may be a horizontal interconnection between a first and a second electrical contact element at a first major surface of the semiconductor die, e.g. interposer. Testing a first signal path may comprise testing a path between the first electrical contact element and a third electrical contact element at the same major surface of the semiconductor die. Testing a second signal path may then comprise testing a path between the second electrical contact element and the same third electrical contact element or another third electrical contact element at the same major surface of the semiconductor die.

In a method according to some embodiments, testing the first signal path may include measuring a characteristic of the electrical component.

In a second aspect, some embodiments provide a semiconductor die, e.g. an interposer, suitable for being tested for manufacturing defects. The semiconductor die comprises a surface with a plurality of electrical contact elements, at least an interconnect-under-test between a first electrical contact element and a second electrical contact element, and an electrical component electrically coupled between the interconnect-under-test and at least one third electrical contact element, optionally between the interconnect-under-test and at least two third electrical contact elements.

In a semiconductor die according to some embodiments, the electrical component may be suitable for allowing formation of a first signal path over a first part of the interconnect-under-test and a deviation path from the interconnect-under-test over the electrical component to a third electrical contact element, and allowing formation of a second signal path over a second part of the interconnect-under-test and a deviation path from the interconnect-under-test over the electrical component to one of the third electrical contact elements. The third electrical contact element used with the first deviation path and the third electrical contact element used with the second deviation path may be one and the same contact element, or may be different contact elements.

In some embodiments, the interconnect-under-test may be a vertical interconnection between a first electrical contact element at a first major surface of the semiconductor die and a second electrical contact element at a second major surface of the semiconductor die opposite to the first major surface. The third electrical contact elements to which the first and second deviation paths connect may be different contact elements. Preferably, such third contact elements are located at opposite major surfaces of the semiconductor die, such that for each measurement a third contact element may be used which is located at the same major surface of the semiconductor die as the first, resp. the second electrical contact element. This allows partial measurements from a single side of the semiconductor die, without requirement for simultaneous access to both sides of the semiconductor die.

In an alternative semiconductor die according to some other embodiments, the interconnect-under-test may be a horizontal interconnection between a first electrical contact element at a first major surface of the semiconductor die and a second electrical contact element at the first major surface of the semiconductor die.

In particular embodiments, the third electrical contact elements to which the first and second deviation paths connect are one and the same contact element. In alternative embodiments, the third electrical contact elements to which the first and second deviation paths connect are different contact elements.

The electrical component may be a component of which an electrical characteristic can be measured. The electrical component may for instance be a diode, such as a diode which may be reused for ESD protection.

The semiconductor die may be any of a passive interposer, an active-lite interposer or an active interposer.

Some embodiment disclosed herein address the challenges of mechanical test access for pre-bond testing of dies such as interposers, for example semiconductor, such as silicon, dies. By inserting a "component" on a deviation path starting between a first and a second part of the interconnect-under-test, the interconnect-under-test is allowed to be tested in a two-step approach: first from one end of the interconnect-under-test to the component, and then from the other end of the interconnect-under-test to the component. If both sub-tests pass, it can be concluded that the total interconnect-under-test is intact. Some embodiments disclosed herein can eliminate a need for simultaneous physical probe access at the two ends of the interconnect-under-test. Some embodiments may be applied for testing vertical interconnects, i.e. where the ends of the interconnect-under-test are located at opposite surfaces of the semiconductor die, which is difficult in view of probing at two sides of the semiconductor die being required. Hence for testing vertical interconnects in accordance with some embodiments disclosed herein, probing can be done first on the top-side of the semiconductor die, and later on the bottom-side thereof, thereby avoiding the dual-side probing on a thinned semiconductor die. Some embodiments may also be applied, alternatively or on top thereof, for testing horizontal interconnects, i.e. where the ends of the interconnect-under-test are located at a same surface of the semiconductor die, which may be particularly challenging if these ends land on fine-pitched microbumps. For testing horizontal interconnects, probing can be done only on the top-side of the semiconductor die, but, in accordance with some embodiments, if this involves too many I/Os in too large arrays, that can be broken up in multiple touch-downs.

In a particular embodiment, the "electrical component" is a diode. Particular types of semiconductor dies to be tested for manufacturing defects of their interconnects are interposers. Interposers with embedded diodes are sometimes referred to as "light-active" or "active-light" interposers, as a diode is an active component which can be added to a passive interposer with the smallest (and therefore cheapest) amount of additional processing steps. The diodes in "light-active" interposers can also be (re-)used to integrate ESD protection functionality, thereby saving cost on the active dies and even on the system package. Such ESD protection diodes would be placed on all external I/Os, and in a particular embodiment, these diodes can be reused to implement the two-step testing that alleviated physical test access requirements.

Particular and preferred aspects of the invention are set out in the accompanying independent and dependent claims. Features from the dependent claims may be combined with features of the independent claims and with features of other dependent claims as appropriate and not merely as explicitly set out in the claims.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, in which:

FIG. 1(a) illustrates an interposer-based 3D die stack in which multiple active dies placed side-by-side on top of and interconnected through an interposer, while FIG. 1(b) illustrates 3D stacking, where multiple 3D towers of active dies are placed side-by-side of top of and interconnected through an interposer, both as known in the art.

Figure 1:
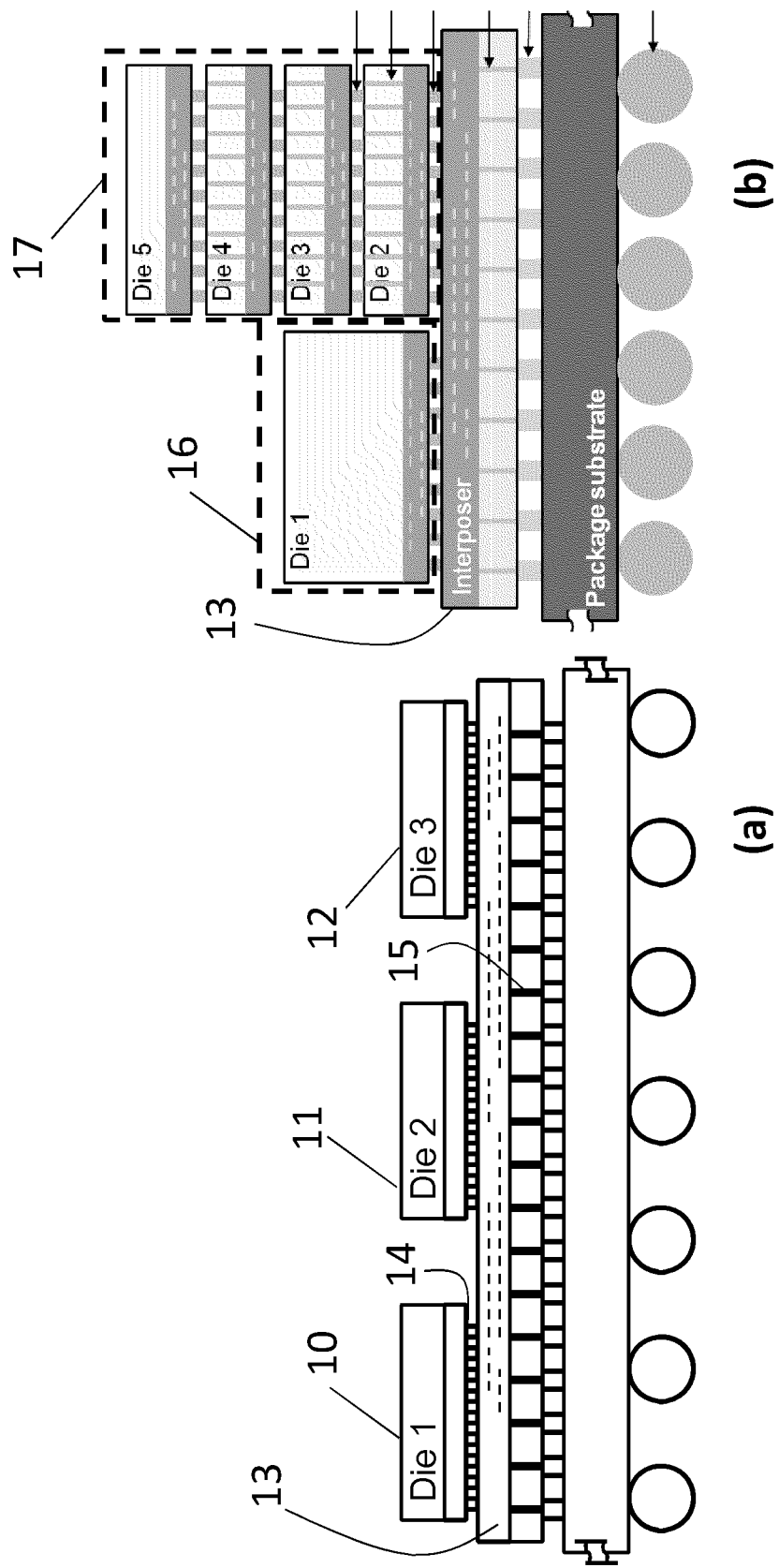

The drawings are only schematic and are non-limiting. In the drawings, the size of some of the elements may be exaggerated and not drawn on scale for illustrative purposes. The dimensions and the relative dimensions do not necessarily correspond to actual reductions to practice of the invention.

Any reference signs in the claims shall not be construed as limiting the scope.

In the different drawings, the same reference signs refer to the same or analogous elements.

DETAILED DESCRIPTION OF CERTAIN ILLUSTRATIVE EMBODIMENTS

The present invention will be described with respect to particular embodiments and with reference to certain drawings but the invention is not limited thereto but only by the claims.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

In the context of the embodiments, an interposer refers to an electrical interface for routing signals between two or more dies. The two or more dies may be, for example. placed side-by-side on the interposer. Also stacks of dies may be placed side-by-side on the interposer. In one aspect, an interposer may be viewed as a bridge between two electronic components, e.g., a die and a board, which functions to electrically connect the two electronic components that have electrical connections having different pitches. For example, an interposer may bridge the components by spreading a connection to a wider pitch, or by rerouting a connection to a different connection. The packaging industry sometimes categorizes an interposer as being "active," "passive," or "active-lite." A passive interposer can refer to an interposer that can make electrical connections predominantly using passive wires, while having a minimum number of, e.g., zero, active device elements (e.g., diodes, transistors, etc.). An "active-lite" interposer can refer to something in between a true passive interposer and an active die. It can contain, for example, wires and a limited number of electronic elements. An "active-lite" interposer can advantageously have the low-cost benefit of a passive interposer and to invest only little to get some extra benefits without going to the price of a full active die.

In the following, features of the embodiments are explained by making reference to an interposer. However, the invention is not limited thereto, and can be applied more generally on any type of semiconductor wafers. Nevertheless, embodiments herein prove to be particularly advantageous in case the semiconductor die is a so-called active-lite interposer (passive interposer with low-cost diode implementation). At present, there is a need for testing vertical interconnects in thinned-down wafers.

Figure 2:
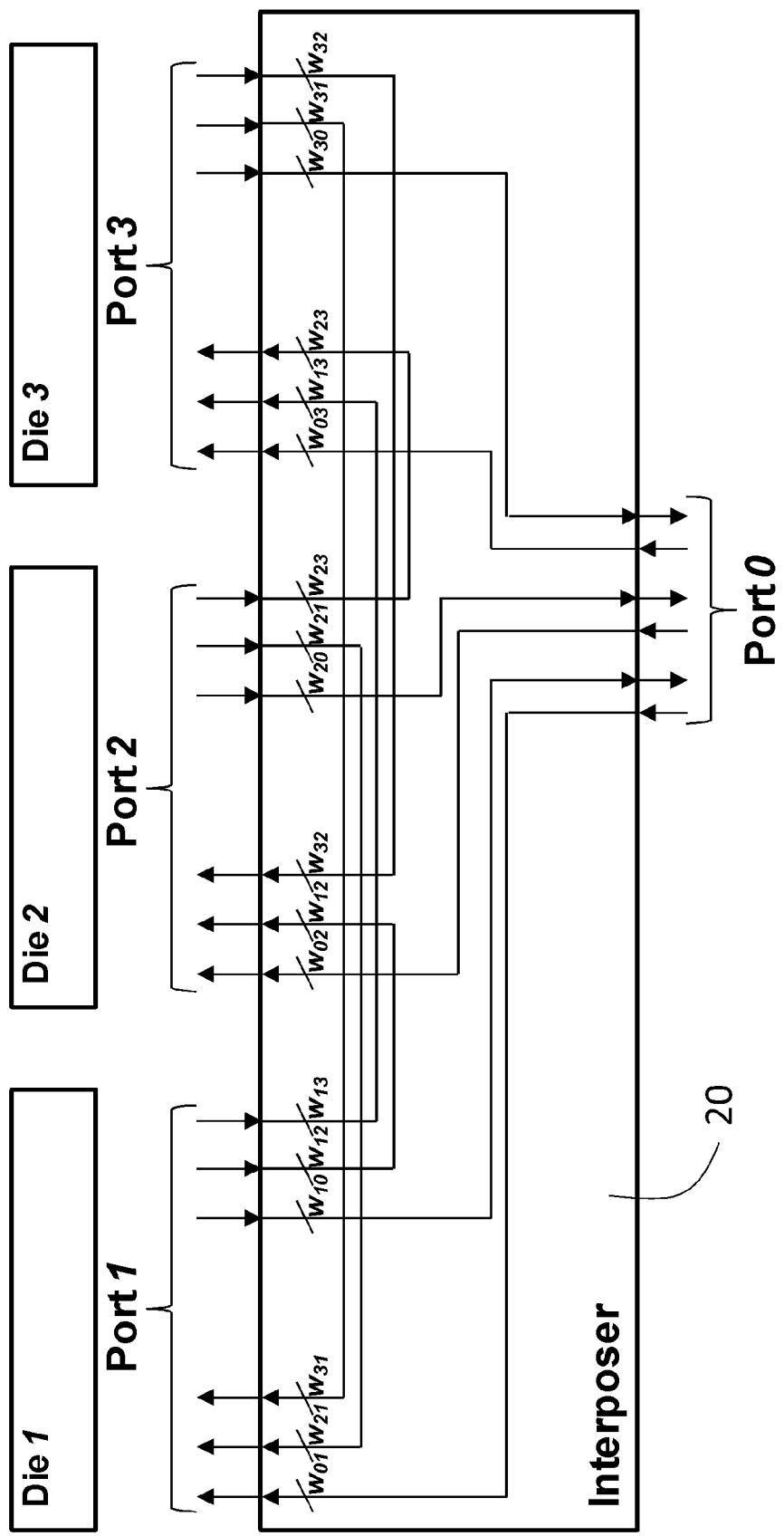
FIG. 2 illustrates an interposer model comprising vertical and horizontal connections, according to some embodiments.

An interposer, for example a semiconductor interposer such as e.g. a silicon interposer, can be represented using a schematic model shown in FIG. 2. The interposer 20 illustrated in FIG. 2 comprises a first port Port 0 for external I/Os at its bottom side, and further comprises ports Port 1, Port 2, Port 3 for each of the active dies Die 1, Die 2, Die 3 to be placed on top of it at its top side. The bottom I/Os at the first port Port 0 include conductive components, e.g. Cu, pillars or C4 bumps, which electrically connect to the package substrate. The top ports Port 1, Port 2, Port 3, may for example include fine-pitch micro-bumps. The interposer 20 provides wire connections between these ports including, e.g., "vertical" connections through TSVs between Port 0 and one or more of Ports X (where X is in {1, 2, 3, . . . }) and the "horizontal" connections between one or more of Ports X and one or more of Ports Y (where X,Y are in {1, 2, 3, . . . }).

Testing an interposer, for example a semiconductor interposer such as a silicon interposer, refers to testing at least the wire connections that make up the interposer 20. Mechanical test access for pre-bond testing of such an interposer can be challenging, for the following reasons:

Testing of wire connections can include accessing both ends of the wire.

Testing of the horizontal connections can include probe access to the micro-bumps at the top-side of the interposer 20. These micro-bumps typically come in large numbers (hundreds to thousands) in large arrays in very fine pitches (currently 40 um and scaling down). Probe access on these micro-bumps may not be trivial and subject of current research, as for example described by Ken Smith et al., in "Evaluation of TSV and Micro-Bump Probing for Wide I/O Testing", Proceedings IEEE International Test Conference (ITC), September 2011. Paper 17.2.

Testing of the vertical connections can include simultaneous probe access to the micro-bumps at the top-side of the interposer (challenging, see above) and to the larger bumps at the bottom-side of the interposer.

Dual-side probing can be challenging, especially if it concerns a thinned (~100 um thin) interposer wafer.

Figure 3:
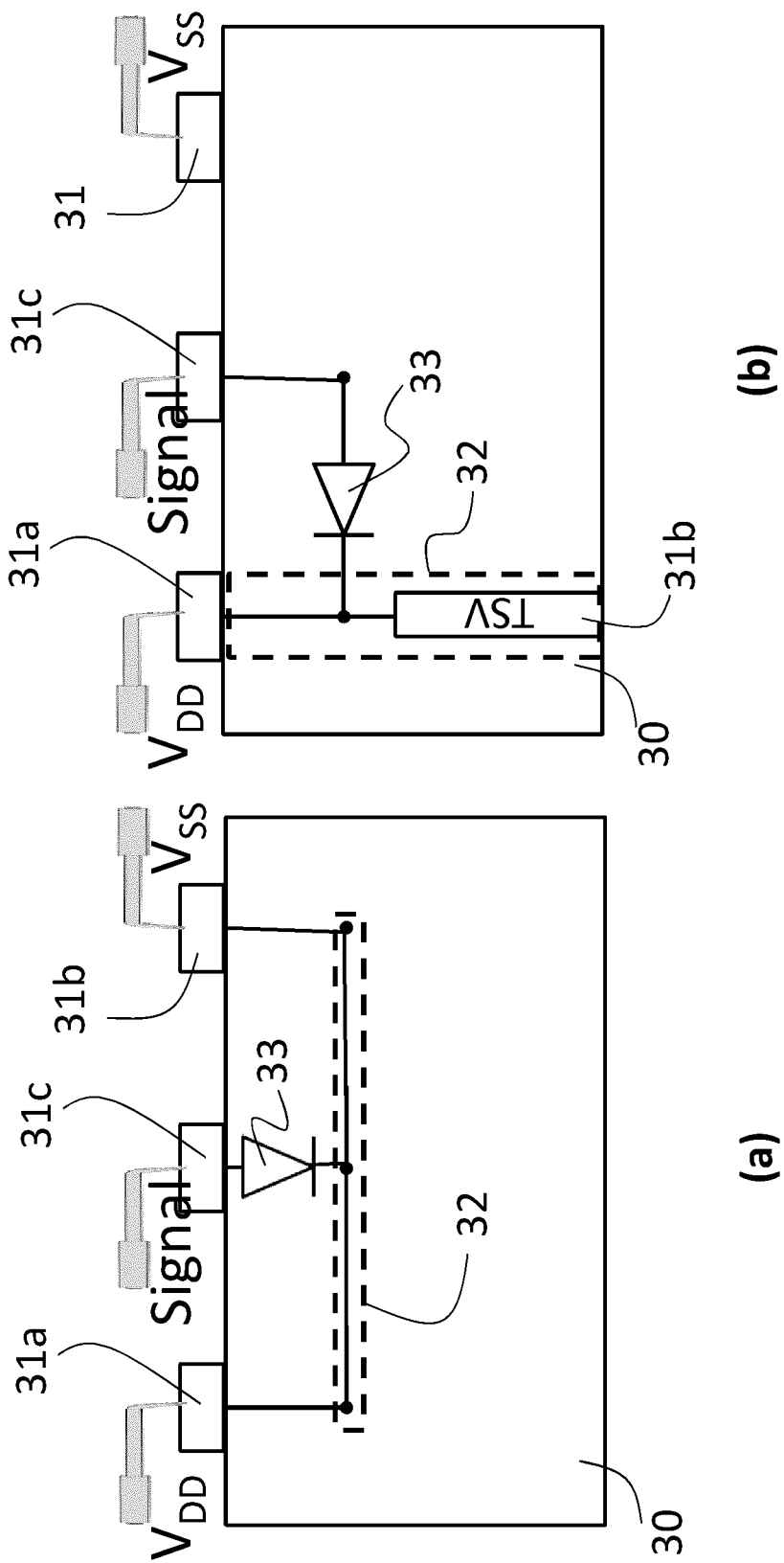
FIG. 3(a) schematically illustrates a method according to a first embodiment for testing a horizontal interconnect.
FIG. 3(b) schematically illustrates a method according to a second embodiment for testing a vertical interconnect.

Embodiments described herein provide an interposer 30 suitable for being tested for manufacturing defects such as opens or shorts. Such interposer 30 is illustrated in FIG. 3(*a*) and FIG. 3(*b*), respectively, wherein the interposer 30 of FIG. 3(*a*) is provided with a horizontal interconnect according to some embodiments, and the interposer 30 of FIG. 3(*b*) is provided with a vertical interconnect according to some other embodiments. In reality, interposers 30 being tested may include a combination of horizontal and/or vertical interconnects. The interposer 30 comprises a surface having a plurality of electrical contact elements 31, 31*a*, 31*b*, 31*c*. At least one interconnect-under-test 32, e.g. a horizontal interconnect or a vertical interconnect, is provided in the interposer 30, between a first electrical contact element 31*a* and a second electrical contact element 31*b*. At least one electrical component 33 is electrically coupled between the interconnect-under-test 32 and at least one third electrical contact element 31*c*.

A method of testing the interposer 30 according to some embodiments includes the following processes:

1) The at least one electrical component 33, e.g. one or more diodes, would be characterized on a pre-defined test structure to calibrate the subsequent measurements.

2) One part or one side of the interposer 30 is probed, and part of the interconnect-under-test is characterized from a probe needle on the first electrical contact element 31*a*, over the part of the interconnect-under-test 32, and over a first deviation path from the interconnect-under-test, over the electrical component 33 and down to a probe needle on the third electrical contact element 31*c*.

3) After probing the first part or first side of the interposer 30, a second part or second side of the interposer 30 is probed, for example after displacement of the probes over the surface of the interposer 30 (at the same time avoiding having to use multiple probe cards simultaneously), or after die/wafer flip, when the backside is exposed. Another part of the connect-under-test 32 is then characterised from the second electrical contact element 31*b* and over a second deviation path from the interconnect-under-test over the same electrical component 33 and down to the third electrical contact element 31*c*.

By using the method described above, an interconnect-under-test 32 can be tested for opens or shorts in two sub-tests: first from the first end of the wire to an electrical component 33 somewhere in between, then from a second end of the wire to the same electrical component 33. If each of the sub-tests pass, it can be concluded that the total interconnect wire does not electrically suffer from a manufacturing defect. By implementing a method in accordance with embodiments disclosed herein, where measurements are done over an intermediate electrical component 33, the need for simultaneous physical probe access at the two ends of the interconnect wire is alleviated or taken away completely.

The yield of the interposer interconnect can then be tested by verifying that the characteristics of the electronic component 33, e.g. the diode characteristics, are similar from both ends of the probing.

It will be appreciated that for testing the vertical interconnect-under-test 32 in the embodiment illustrated in FIG. 3(*b*) would may involve simultaneous probing on two sides of the wafer or die, which may not be practical or very difficult to implement: first a first measurement may be performed between the first electrical contact element 31*a*, over the electrical component 33 to the third electrical contact element 31*c*; and thereafter a second measurement may be performed between the second electrical contact element 31*b*, over the electrical component 33, also to the third electrical contact element 31*c*.

Figure 4:
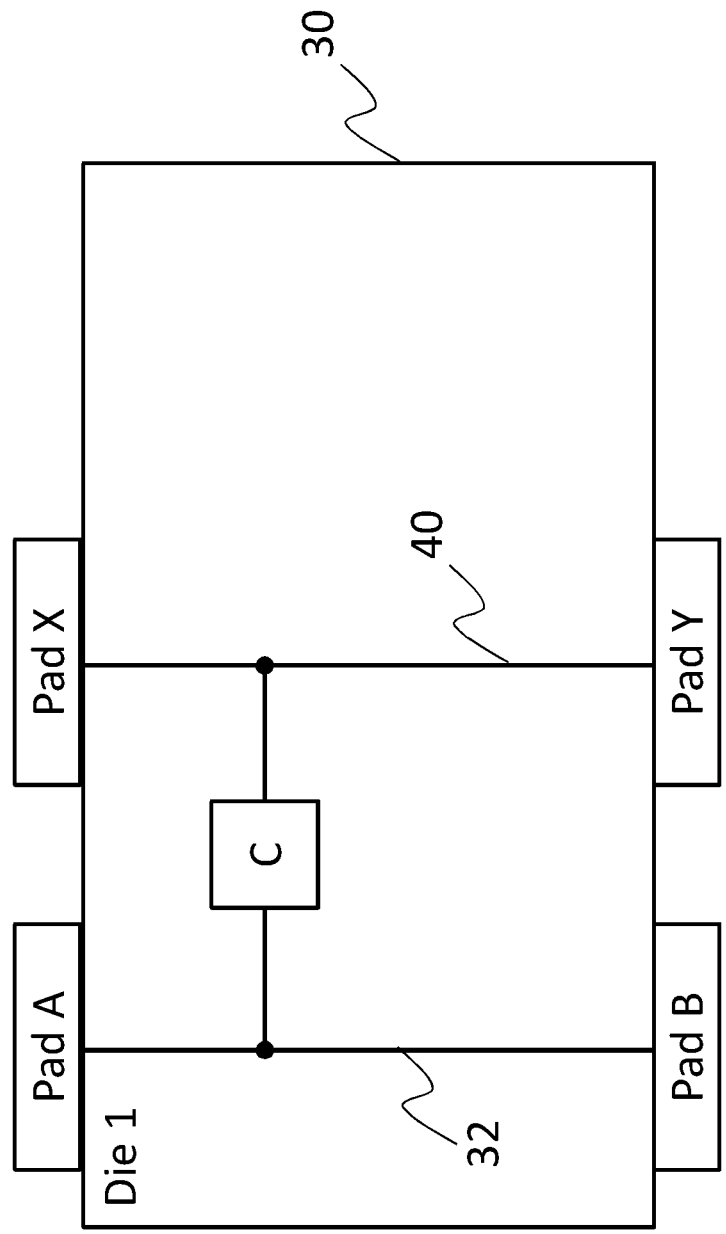
FIG. 4 schematically illustrates a semiconductor die, e.g. an interposer, with a vertical interconnect and design-for-test circuitry according to some embodiments. Such substrate may be used with methods according to some embodiments.
Figure 5A:
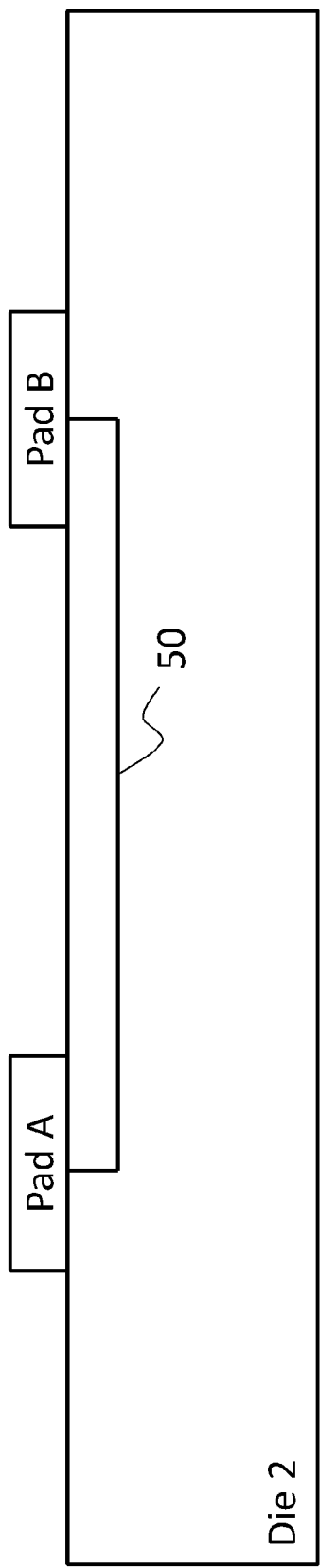
FIG. 5(a) schematically illustrates a semiconductor die, e.g. an interposer, with a horizontal interconnect and, FIG. 5(b) schematically illustrates a similar semiconductor die with design-for-test circuitry according to some embodiments. Such substrate may be used with methods according to some embodiments.
Figure 5B:
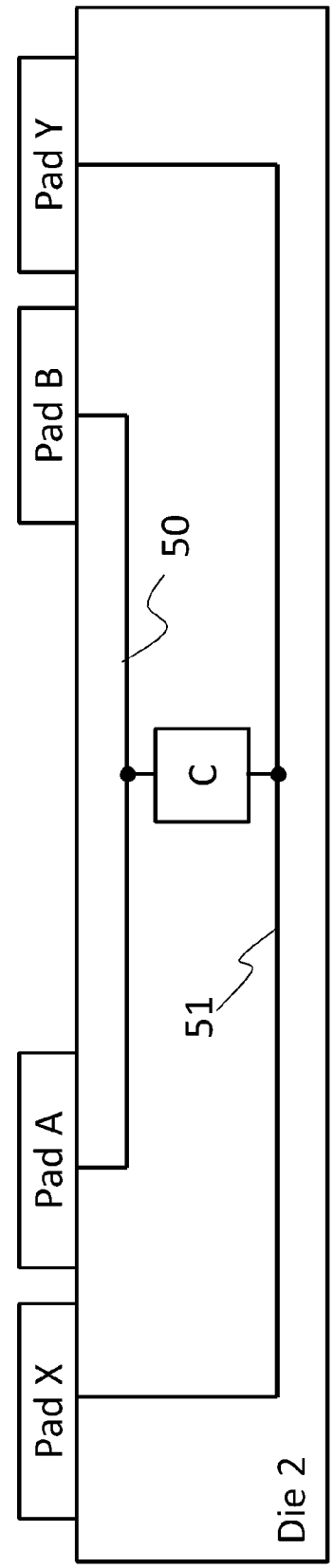
Figure 6:
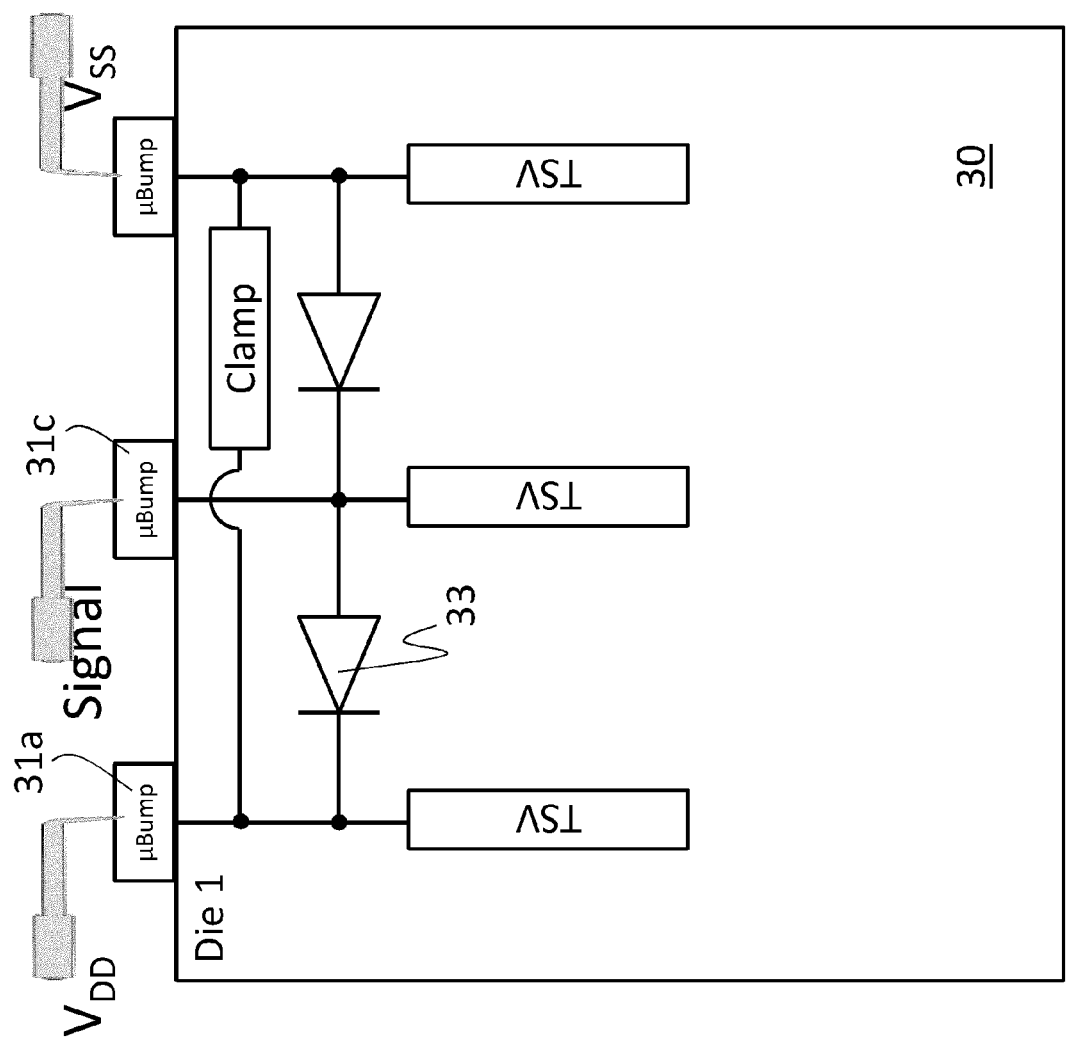
FIG. 6 and FIG. 7 schematically illustrate a method according to a third embodiment for testing a plurality of vertical interconnects.

In order to avoid dual side probing, a two-step method for testing an interconnect such as a vertical interconnect in accordance with some embodiments is illustrated in more detail in FIG. 4, FIG. 5 and FIG. 6.

FIG. 4 illustrates a semiconductor die, Die 1, e.g., an interposer, comprising a vertical interconnect 32 (interconnect-under-test) between a first electrical contact element, Pad A, and a second electrical contact element, Pad B, according to some embodiments. The first electrical contact element Pad A and the second electrical contact element Pad B are provided at opposite sides of the semiconductor die. The semiconductor die furthermore comprises design-for-test circuitry in accordance with embodiments. The design-for-test circuitry comprises a second vertical interconnect 40 between a third electrical contact element Pad X and a fourth electrical contact element Pad Y. The third electrical contact element Pad X is located at the same side of the semiconductor die Die 1 as the first electrical contact element Pad A, and the fourth electrical contact element Pad Y is located at the same side of the semiconductor die Die 1 as the second electrical contact element Pad B. The second vertical interconnect 40 is connected to the first vertical interconnect 32 via a circuit C. The second vertical interconnect may be a dedicated interconnect for testing purposes, or may be an existing vertical interconnect part of the functional design. In various embodiments, the circuit C can be reused from functional design, or can be provided as a dedicated circuit for testing purposes.

Desirable characteristics of the circuit C can include: (1) it is implementable in the die's process technology; (2) it should provide a proof of intact existence of the to-be-tested wires leading up to it; and (3) the impact on functional operation of the die should be minimal or zero. The circuit C may, for instance, include a wire (e.g. in a passive or active-lite interposer or in an active die), a diode (in an active-lite interposer or in an active die) and/or a simple electronic circuit, e.g., an active buffer or an inverter (e.g., in an active die).

It will be appreciate that the desirable characteristic of the circuit C being measured can depend, on the type of circuit. For example, in cases the circuit C includes a simple wire, connectivity can be tested, e.g. by via a resistance measurement, between Pad A and Pad X, and between Pad B and Pad Y, respectively, in order to determine that the interconnect between Pad A and Pad B exists. In cases where the circuit C includes a diode, its I-V, curve can be measured. While an I-V curve of a diode may take longer to measured, it can offer more detailed insight in the state of the interconnect between Pad A and Pad B.

The two-step method in accordance with embodiments as described above, comprises in a first step probing on the first electrical contact Pad A and the third electrical contact Pad X, thus testing the electrical connection between them. This test proves the intact existence of the upper part, e.g. upper half of the first interconnect (between Pad A and Pad B), and the intact existence of the upper part, e.g. upper half of the second interconnect (between Pad X and Pad Y), over the circuit C. If one of these would be broken or otherwise damaged, this will be shown in the test results.

Thereafter, in a second step, probing takes place on the second and fourth electrical contact pads Pad B and Pad Y, thus testing the electrical connection between them. This test proves the intact existence of the lower part, e.g. lower half of the first interconnect (between Pad A and Pad B), and the intact existence of the lower part, e.g. lower half of the second interconnect (between Pad X and Pad Y), over the circuit C. If one of these would be broken or otherwise damaged, this will be shown in the test results.

The upper part and the lower part of the interconnect form the complete interconnect.

If both the first step and the second step complete successfully, it can be determined that the entire first interconnect between Pad A and Pad B, and the entire second interconnect between Pad X and Pad Y are intact. It can thus be seen that not only the first interconnect between Pad A and Pad B, but also the second interconnect 40 between Pad X and Pad Y are tested.

FIG. 5(a) illustrates a semiconductor die Die 2, e.g. an interposer, comprising a horizontal interconnect 50 (interconnect-under-test) between a first electrical contact element Pad A and a second electrical contact element Pad B, according to some embodiments. Die 2 may represent a configuration where first electrical contact element Pad A and the second electrical contact element Pad B provided at the same side of the semiconductor die Die 2 and are configured such that it may be difficult or even impossible to probe first and second electrical elements Pad A and Pad B simultaneously. Such configuration may exist, for example, where there are so many probe pads on Die 2 that it would require a very large and expensive probe card to contact all of them in a single touch-down. In FIG. 5(b), the semiconductor die Die 2 furthermore comprises design-for-test circuitry in accordance with embodiments. The design-for-test circuitry comprises a second horizontal interconnect 51 between a third electrical contact element Pad X and a fourth electrical contact element Pad Y. The third and fourth electrical contact elements Pad X and Pad Y are provided at the same side as the first and second electrical contact elements Pad A and Pad B. The second horizontal interconnect 51 is connected to the first horizontal interconnect 50 via a circuit C. The second horizontal interconnect 51 may be a dedicated interconnect for testing purposes, or may be an existing horizontal interconnect 50. What has been said with respect to the circuit C when referring to FIG. 4 also holds for the embodiment of FIG. 5(b), but is not repeated here.

The two-step method in accordance with some embodiments described herein, as described above, comprises a first step which includes probing on the first electrical contact Pad A and on the third electrical contact Pad X, thus testing the electrical connection between them. This test can determine, for example, the intact existence of the left part, e.g. left half of the first interconnect (between Pad A and Pad B), and the intact existence of the left part, e.g. left half of the second interconnect (between Pad X and Pad Y), over the circuit C. If one of these would be broken or otherwise damaged, this will be shown in the test results.

Thereafter, the two-step method further comprises a second step, in which probing takes place on the second and fourth electrical contact pads Pad B and Pad Y, thus testing the electrical connection between them. This test can determine, for example, the intact existence of the right part, e.g. right half of the first interconnect (between Pad A and Pad B), and the intact existence of the right part, e.g. right half of the second interconnect (between Pad X and Pad Y), over the circuit C. If one of these would be broken or otherwise damaged, this will be shown in the test results.

The left part and the right part of an interconnect form the complete horizontal interconnect.

If both the first step and the second step complete successfully, it can be concluded that the entire first interconnect between Pad A and Pad B, and the entire second interconnect between Pad X and Pad Y are intact. It can thus be seen that not only the first interconnect between Pad A and Pad B, but also the second interconnect 40 between Pad X and Pad Y are tested.

Figure 7:
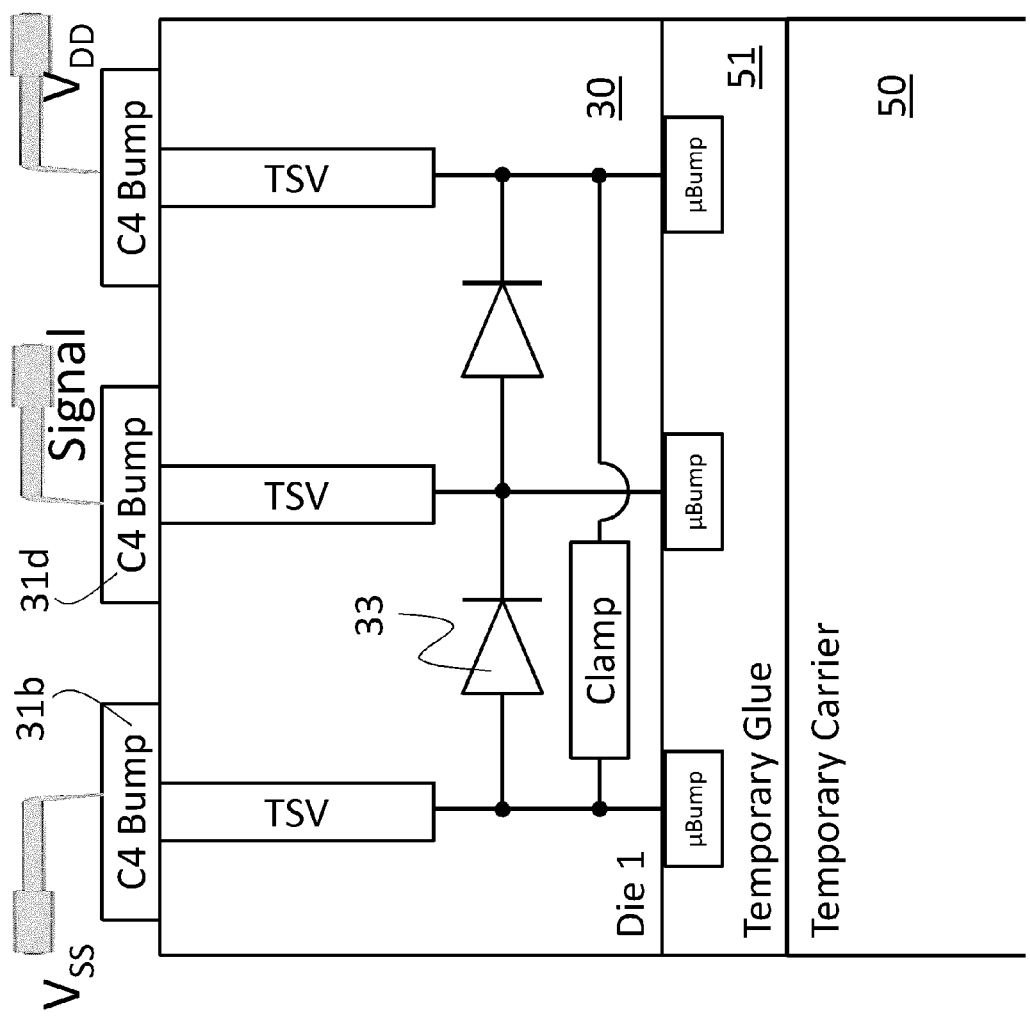

FIG. 6 and FIG. 7 illustrate a method of manufacturing a device according to some embodiments, as well as a method of probing such device, which can include an active-lite interposer.

Referring to FIG. 6, in a first step, an interposer 30, prior to thinning and stacking, is provided with a plurality of vertical interconnects, which can still buried in the thick wafer. Probing is performed on a first and a third electrical contact element 31a, 31c at the wafer front end. During probing, characteristics of the electrical element 33, e.g. diode, can be measured to determine that a vertical path from the first electrical contact element 31a to the electrical element 33 and from the third electrical contact element 31c to the electrical element 33 exists.

In a second step, the TSVs of the interposer 30 can be exposed, by, e.g., thinning the interposer 30, and provided with second and fourth electrical contact elements 31b, 31d. Referring to FIG. 7, in some embodiments, for ease of handling, the thinned interposer 30 may be temporarily mounted on a temporary carrier 50, e.g. a glass or semiconductor wafer such as a silicon wafer, e.g. by a temporary glue layer 51. During the second step of the testing method according to embodiments, characteristics of the electrical element 33, e.g. diode, can be measured to determine that a vertical path from the second electrical contact element 31b to the electrical element 33 and from the fourth electrical contact element 31d to the electrical element 33 exists.

From the results of both the first and the second step of the method, it can be determined whether the interconnect-under-test, in the example illustrated two vertical interconnects-under-test, are defective or not.

In principle, any device of known and stable characteristics can be used as electrical component 33 for implementing a device and a method according to embodiments. The use of diodes is a particularly advantageous embodiment, as embedding diodes on the interposer 30 at the IO connections is already a technique envisioned for future interposers, as illustrated in FIG. 6. Using them for testing would then be done without any extra hardware cost.

Figure 8:
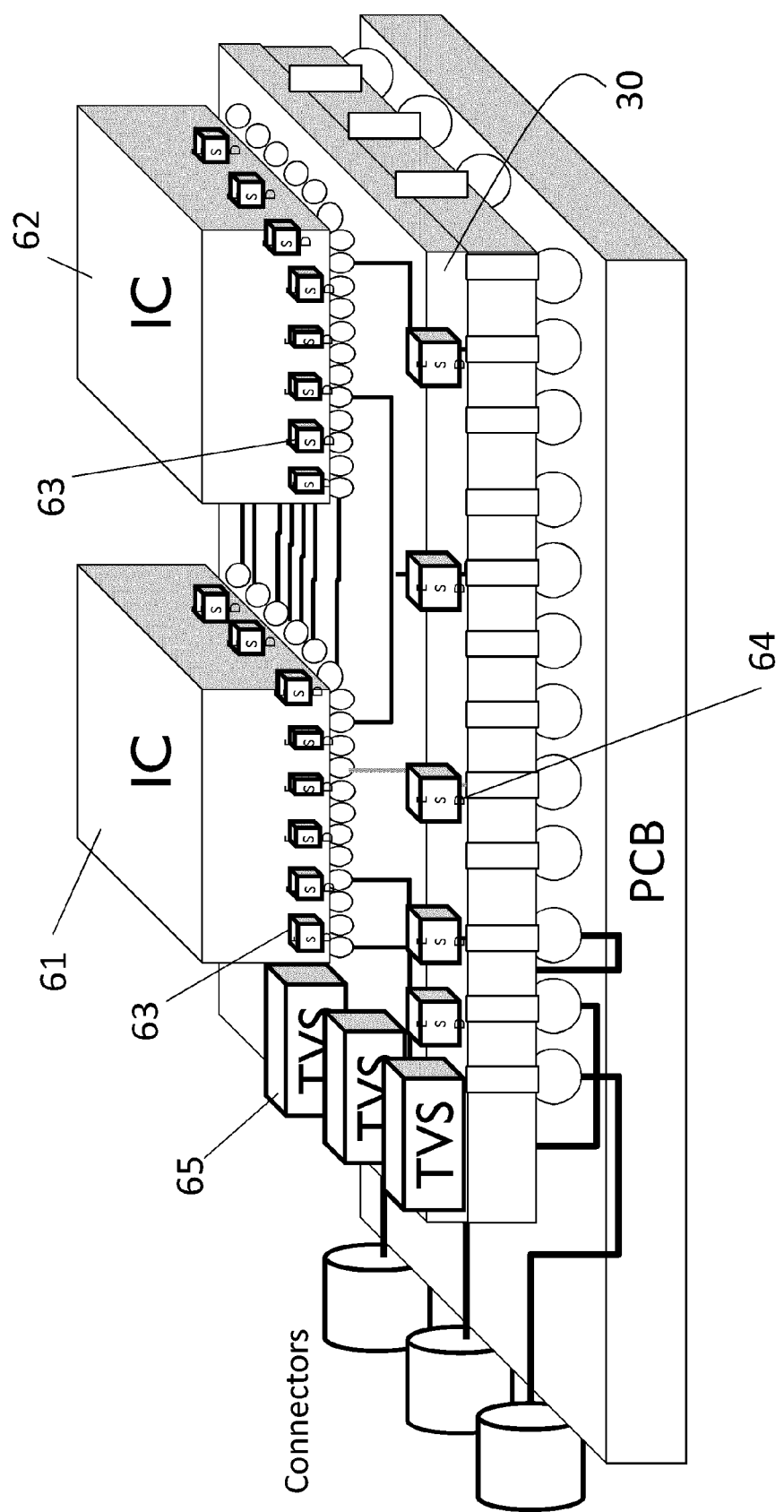
FIG. 8 and FIG. 9 illustrate the dual use of diodes as electrical elements for testing, and for ESD protection of the circuits during normal use of the IC stack, according to some embodiments.

FIG. 8 illustrates an interposer 30 with mounted thereon a first IC 61 and a second IC 62, according to some embodiments. One or both of the first IC 61 and the second IC 62 includes an electrostatic discharge (ESD) protection element 63 on a microbump IO ring. Furthermore, it is desired to have ESD protection elements 64 on the interposer IO ring. These ESD protection elements 64 can be used for interconnect testing in accordance with embodiments. Furthermore, transient voltage suppressor (TVS) elements 65 can be provided for system ESD protection. It is an advantage of such embodiment that ESD protection elements 63 may take minimum area on every stacked IC 61, 62, while at the same time, a lower amount of off-chip ESD components for system-level ESD protection are required.

Figure 9:
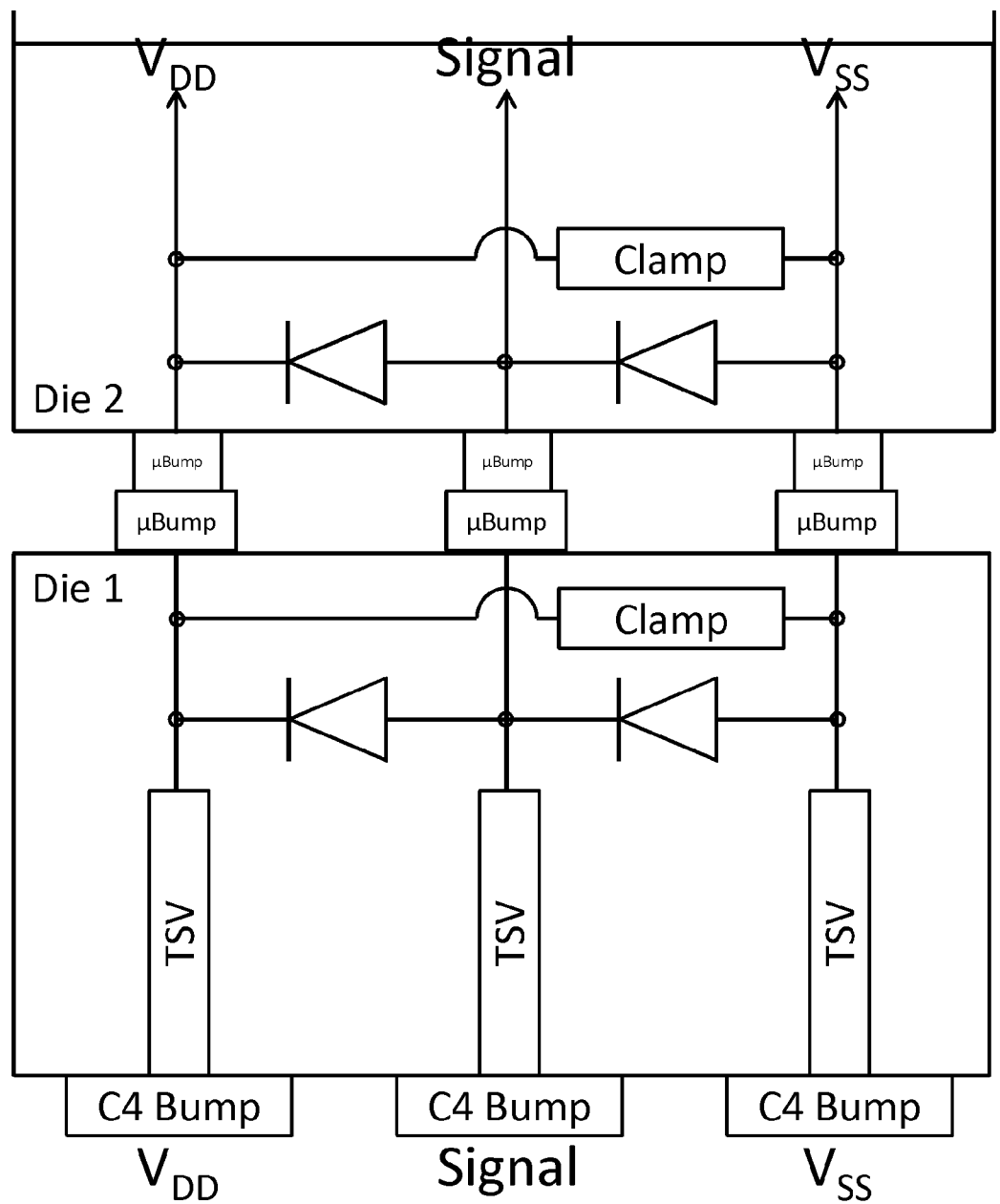

FIG. 9 schematically illustrates a system after stacking, in accordance with some embodiments. Die 2 can include, for example, a stacked active die, with light ESD protection circuitry (100 Volt HBM). Die 1 can include, for example, an active-lite interposer, comprising system-level ESD protection circuitry, replacing TVS's (1 kVolt HBM).

Figure 10:
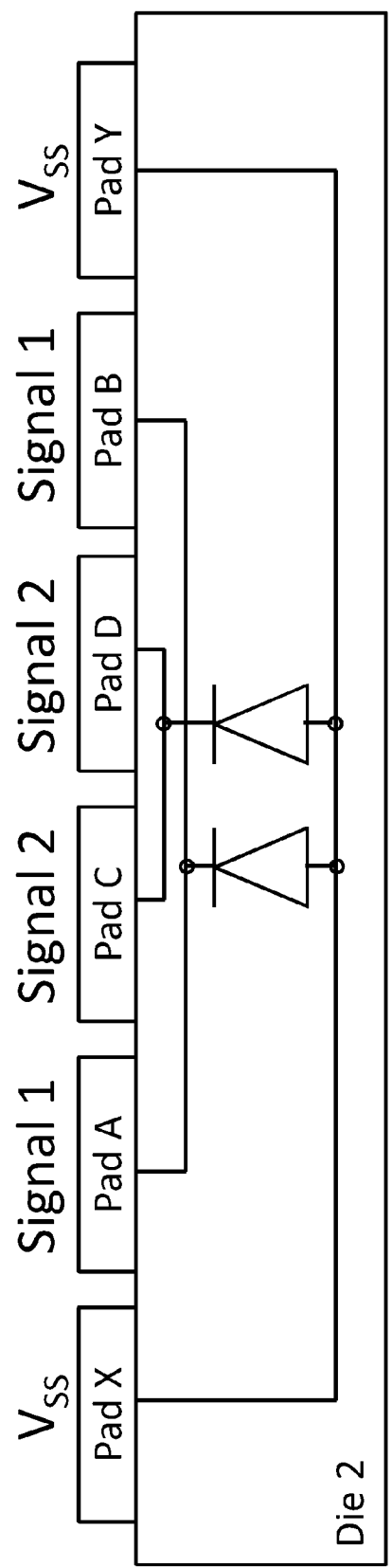
FIG. 10 illustrates shared use of test wires in accordance with some embodiments.

In order to avoid the additional area cost of dedicated test wires, in accordance with some embodiments, test wires can be shared. In particular embodiments, test wires can be reused functional wires. For instance, the functional $V_{DD}$ or $V_{SS}$ line may be reused as test wire, with as circuit C a properly configured diode. Alternatively, one wire can serve as test wire for multiple functional wires, as illustrated in FIG. 10. In this case, the functional VDD/VSS line between Pad X and Pad Y is reused as test wire for multiple signal lines, in particular the signal line between Pad A and Pad B, and the signal line between Pad C and Pad D, with as circuit C a properly configured diode between the shared line and each of the signal lines.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

It should be noted that the use of particular terminology when describing certain features or aspects of the disclosure should not be taken to imply that the terminology is being re-defined herein to be restricted to including any specific characteristics of the features or aspects of the disclosure with which that terminology is associated.

What is claimed is:

1. A method of testing an interconnect in a semiconductor die, comprising:
    providing the semiconductor die, wherein the semiconductor die comprises:
        a first interconnect-under-test arranged between a first electrical contact element and a second electrical contact element, and
        a second interconnect-under-test arranged between a third electrical contact element and a fourth electrical contact element,
        wherein the second interconnect-under-test is connected to the first interconnect-under test via an electrical component;
    testing a first signal path in the semiconductor die for manufacturing defects, the first signal path comprising a first part of the first interconnect-under-test and a first deviation path from the first interconnect-under-test through the electrical component to the third electrical contact element, thus obtaining first test results, wherein testing the first signal path comprises probing the first electrical contact element and the third electrical contact element;
    testing a second signal path in the semiconductor die for manufacturing defects, the second signal path comprising a second part of the first interconnect-under-test and a second deviation path from the first interconnect-under-test through the electrical component to the fourth electrical contact element, thus obtaining second test results, wherein testing the second signal path comprises probing the second electrical contact element and the fourth electrical contact element;
    determining whether or not the first interconnect-under-test suffers from manufacturing defects from the first and second test results; and
    determining whether or not the second interconnect-under-test suffers from manufacturing defects from the first and second test results,
    wherein the first electrical contact element and the third electrical contact element are formed at a first major surface on the same side of the semiconductor die.

2. The method of claim 1,
    wherein the first interconnect-under-test comprises a first vertical interconnection between the first electrical contact element and the second electrical contact element formed at a second major surface of the semiconductor die on an opposite side of the first major surface, and
    wherein the second interconnect-under-test comprises a second vertical interconnection between the third electrical contact element and the fourth electrical contact element formed at the second major surface of the semiconductor die.

3. The method of claim 2, wherein testing the second signal path further comprises testing a path between the second electrical contact element and the third electrical contact element.

4. The method of claim 1,
    wherein the first interconnect-under-test comprises a first horizontal interconnection between the first and second electrical contact elements formed at the first major surface of the semiconductor die, and
    wherein the second interconnect-under-test comprises a second horizontal interconnection between the third and fourth electrical contact elements formed at the first major surface of the semiconductor die.

5. The method of claim 4, wherein testing the second signal path comprises testing a path between the second and third electrical contact elements.

6. The method of claim 1, wherein testing the first signal path includes measuring a characteristic of the electrical component.

7. The method of claim 1, wherein the semiconductor die is an active-lite interposer comprising passive and active device components.

8. The method of claim 7, wherein the active-lite interposer is provided, prior to thinning and stacking, with a plurality of vertical interconnects that are buried in a wafer, wherein probing on the first electrical contact element and on the third electrical contact element is performed at a wafer front end, wherein, during probing on the first electrical contact element and on the third electrical contact element, an electrical characterization is performed on the electrical element to determine that a vertical path from the first electrical contact element to the electrical element and from the third electrical contact element to the electrical element exists.

9. The method of claim 8, wherein, after probing on the first electrical contact element and on the third electrical contact element, through-silicon vias (TSVs) of the active-lite interposer are exposed, by thinning the active-interposer, and provided with the second and fourth electrical contact elements, wherein, during probing on the second electrical contact element and on the fourth electrical contact element, an electrical characterization is performed on the electrical element to determine that a vertical path from the second electrical contact element to the electrical element and from the fourth electrical contact element to the electrical element exists.

10. The method of claim 9, further comprising mounting the thinned interposer temporarily on a temporary carrier.

11. A semiconductor die adapted to be tested for manufacturing defects, the semiconductor die comprising:
    a surface having a plurality of electrical contact elements;

a first interconnect-under-test between a first electrical contact element and a second electrical contact element;
a second interconnect-under-test between a third electrical contact element and a fourth electrical contact element,
wherein the second interconnect-under-test is connected to the first interconnect-under test via an electrical component;
a first signal path in the semiconductor die configured for testing for manufacturing defects by obtaining first test results, the first signal path comprising a first part of the first interconnect-under-test and a first deviation path from the first interconnect-under-test through the electrical component to the third electrical contact element, wherein the first signal path is configured to be tested by probing the first electrical contact element and the third electrical contact element;
second signal path in the semiconductor die configured for testing for manufacturing defects by obtaining second test results, the second signal path comprising a second part of the first interconnect-under-test and a second deviation path from the first interconnect-under-test through the electrical component to the fourth electrical contact element, wherein the second signal path is configured to be tested by probing the second electrical contact element and the fourth electrical contact element;
wherein at least three of the first electrical contact element, the second electrical contact element, the third electrical contact element and the fourth electrical contact element are formed at a first major surface on the same side of the semiconductor die.

12. The semiconductor die of claim 11, wherein the first interconnect-under-test comprises a first horizontal interconnection between the first and second electrical contact elements formed at the first major surface of the semiconductor die.

13. The semiconductor die of claim 12, wherein the second interconnect-under-test comprises a second horizontal interconnection between the third a electrical contact element and the fourth electrical element each formed at the first major surface of the semiconductor die.

14. The semiconductor die of claim 11, wherein the first interconnect-under-test comprises a vertical interconnection between the first electrical contact element at the first major surface of the semiconductor die and a second electrical contact element at a second major surface of the semiconductor die opposite to the first major surface.

15. The semiconductor die of claim 14, wherein the third electrical contact element to which the first and second deviation paths connect comprise different contact elements.

16. The semiconductor die of claim 14, wherein the third electrical contact elements to which the first and second deviation paths connect comprise a same contact element.

17. The semiconductor die of claim 11, wherein the electrical component comprises a diode.

18. The semiconductor die of claim 11, wherein the die comprises at least one of a passive interposer, an active-lite interposer or an active interposer.

* * * * *

UNITED STATES PATENT AND TRADEMARK OFFICE
CERTIFICATE OF CORRECTION

| | | |
|---|---|---|
| PATENT NO. | : 9,678,142 B2 | Page 1 of 1 |
| APPLICATION NO. | : 14/247019 | |
| DATED | : June 13, 2017 | |
| INVENTOR(S) | : Julien Ryckaert et al. | |

It is certified that error appears in the above-identified patent and that said Letters Patent is hereby corrected as shown below:

In Column 2 at Line 59, Change "interposer," to --interposer.--.

In Column 7 at Line 65, Change "for example." to --for example,--.

In Column 13 at Line 42, In Claim 1, change "interconnect-under test" to --interconnect-under-test--.

In Column 15 at Line 7 (approx.), In Claim 11, change "interconnect-under test" to --interconnect-under-test--.

In Column 16 at Line 10, In Claim 13, after "third" delete "a".

Signed and Sealed this
Twenty-fourth Day of October, 2017

Joseph Matal
*Performing the Functions and Duties of the*
*Under Secretary of Commerce for Intellectual Property and*
*Director of the United States Patent and Trademark Office*